United States Patent
Oh et al.

(10) Patent No.: US 10,242,926 B2
(45) Date of Patent: Mar. 26, 2019

(54) WAFER LEVEL CHIP SCALE PACKAGE STRUCTURE AND MANUFACTURING METHOD THEREOF

(71) Applicant: Alpha and Omega Semiconductor (Cayman) Ltd., Sunnyvale, CA (US)

(72) Inventors: Cheow Khoon Oh, The Hacienda (SG); Ming-Chen Lu, Shanghai (CN); Xiaoming Sui, Shanghai (CN); Bo Chen, Shanghai (CN); Vincent Xue, Shanghai (CN)

(73) Assignee: ALPHA AND OMEGA SEMICONDUCTOR (CAYMAN) LTD., Sunnyvale, CA (US)

( * ) Notice: Subject to any disclaimer, the term of this patent is extended or adjusted under 35 U.S.C. 154(b) by 0 days.

(21) Appl. No.: 15/197,609

(22) Filed: Jun. 29, 2016

(65) Prior Publication Data
US 2018/0005912 A1    Jan. 4, 2018

(51) Int. Cl.
*H01L 21/56* (2006.01)
*H01L 21/78* (2006.01)
(Continued)

(52) U.S. Cl.
CPC ........ *H01L 23/3114* (2013.01); *H01L 21/561* (2013.01); *H01L 21/6835* (2013.01); *H01L 21/78* (2013.01); *H01L 21/568* (2013.01); *H01L 24/13* (2013.01); *H01L 2221/6834* (2013.01); *H01L 2221/68327* (2013.01); *H01L 2221/68372* (2013.01); *H01L 2221/68377* (2013.01); *H01L 2224/0401* (2013.01);
(Continued)

(58) Field of Classification Search
CPC ............. H01L 23/3114; H01L 23/3171; H01L 23/5226; H01L 23/53228; H01L 24/11; H01L 24/14; H01L 24/27; H01L 24/29; H01L 21/561; H01L 21/565; H01L 21/6836; H01L 21/78
See application file for complete search history.

(56) References Cited

U.S. PATENT DOCUMENTS

| | | | | |
|---|---|---|---|---|
| 5,173,766 A | * | 12/1992 | Long | ........................ H01L 21/50 257/687 |
| 5,674,785 A | * | 10/1997 | Akram | ..................... H01L 23/13 257/E23.004 |
| 5,767,010 A | * | 6/1998 | Mis | ..................... H01L 21/2885 257/E21.508 |

(Continued)

*Primary Examiner* — Dale E Page
*Assistant Examiner* — Quovaunda Jefferson
(74) *Attorney, Agent, or Firm* — Chen-Chi Lin (57) ABSTRACT

A wafer level chip scale package (WLCSP) structure and a manufacturing method are disclosed. The WLCSP structure comprises a semiconductor die and a stack. The stack comprises a protective tape and a molding compound. A portion of a first interface surface between the molding compound and the protective tape is curved. The manufacturing method comprises the steps of forming a semiconductor structure; attaching the semiconductor structure on a dummy wafer; performing a first dicing process using a first cutting tool; depositing a molding compound; removing the dummy wafer; performing a second dicing process with a second cutting tool. A first aperture of the first cutting tool is larger than a second aperture of the second cutting tool. The portion of the first interface surface being curved reduces the possibility of generation of cracks in the WLCSP structure.

19 Claims, 6 Drawing Sheets

(51) Int. Cl.
*H01L 23/00* (2006.01)
*H01L 23/31* (2006.01)
*H01L 21/683* (2006.01)

(52) U.S. Cl.
CPC ............ *H01L 2224/05624* (2013.01); *H01L 2224/11334* (2013.01); *H01L 2224/131* (2013.01); *H01L 2224/13013* (2013.01); *H01L 2224/13022* (2013.01); *H01L 2224/13082* (2013.01); *H01L 2224/13147* (2013.01); *H01L 2224/94* (2013.01)

(56) References Cited

U.S. PATENT DOCUMENTS

| | | | | |
|---|---|---|---|---|
| 6,072,239 | A * | 6/2000 | Yoneda | H01L 24/11 257/730 |
| 6,294,439 | B1 * | 9/2001 | Sasaki | H01L 21/3043 438/464 |
| 9,209,156 | B2 | 12/2015 | Len et al. | |
| 2004/0201097 | A1 * | 10/2004 | Ohsumi | H01L 23/3114 257/737 |
| 2004/0217470 | A1 * | 11/2004 | Takano | H01L 21/4842 257/734 |
| 2005/0148160 | A1 * | 7/2005 | Farnworth | H01L 21/3043 438/462 |
| 2011/0227219 | A1 * | 9/2011 | Alvarado | H01L 24/03 257/738 |
| 2014/0015124 | A1 * | 1/2014 | Fay | H01L 24/11 257/737 |
| 2014/0091473 | A1 * | 4/2014 | Len | H01L 24/05 257/774 |

* cited by examiner

FIG. 12

WAFER LEVEL CHIP SCALE PACKAGE STRUCTURE AND MANUFACTURING METHOD THEREOF

FIELD OF THE INVENTION

This invention relates generally to a semiconductor packaging technology. More particularly, the present invention relates to a wafer level chip scale package (WLCSP) structure and the method of manufacturing the WLCSP structures.

BACKGROUND OF THE INVENTION

Wafer level chip scale packaging (WLCSP) is a packaging technology of molding flip chips at a wafer level without using lead frames. WLCSP forms package structures having thinner body sizes. WLCSP is widely used in semiconductor packaging industry.

During packaging process and subsequent reliability test, cracks are frequently generated between layers of package structures. Minor cracks between a protective tape and a molding compound are often observed. Having the presence of minor cracks, it is more challenging to conduct subsequent backside treatment of semiconductor chips formed on the silicon wafer. Moisture, oxygen and other impurities may come into the package structures through the cracks; may erode components inside the package structures; and may affect the performance of the package structures.

SUMMARY OF THE INVENTION

A wafer level chip scale package (WLCSP) structure and a manufacturing method are disclosed. The WLCSP structure comprises a semiconductor die and a stack. The stack comprises a protective tape and a molding compound. A portion of a first interface surface between the molding compound and the protective tape is curved. The manufacturing method comprises the steps of forming a semiconductor structure; attaching the semiconductor structure on a dummy wafer; performing a first dicing process using a first cutting tool; depositing a molding compound; removing the dummy wafer; performing a second dicing process with a second cutting tool. A first aperture of the first cutting tool is larger than a second aperture of the second cutting tool. The portion of the first interface surface being curved reduces the possibility of generation of cracks in the WLCSP structure.

DETAILED DESCRIPTION OF THE INVENTION

Figure 1:
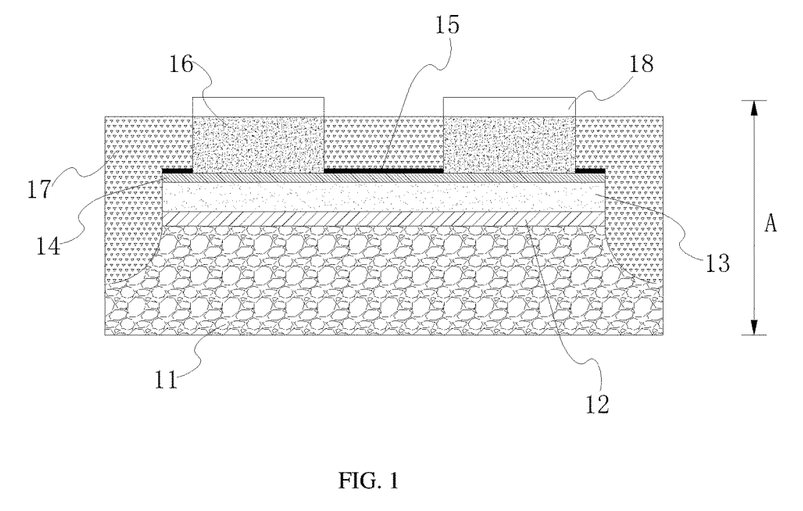
FIG. 1 is a cross-sectional schematic diagram of a wafer level chip scale package (WLCSP) structure in examples of the present disclosure.

FIG. 1 is a cross-sectional schematic diagram of a wafer level chip scale package (WLCSP) structure in examples of the present disclosure. The WLCSP structure includes a protective tape 11, a first metal layer (for example, a back metal) 12, a substrate (for example, a silicon substrate) 13, a second metal layer (for example, an aluminum layer) 14 and a passivation layer (PV) 15. The protective tape 11, the first metal layer 12, the substrate 13, the second metal layer 14 and the passivation layer 15 are arranged in the given order in a vertical direction. In examples of the present disclosure, the vertical direction is parallel to a thickness direction of the substrate 13. In examples of the present disclosure, the vertical direction is perpendicular to a bottom surface of the protective tape 11.

In examples of the present disclosure, the protective tape 11 has a raised center part and arc-shaped side edges. In examples of the present disclosure, an arc-shaped side edge is a curved interface surface (for example, a portion of an interface between the protective tape 11 and molding compound 17). In one example, an arc-shaped side edge has a constant radius of curvature. In another example, an arc-shaped side edge has a progressive changing of the radii of curvatures from a first end to a second end of the side edges. The first metal layer 12 is attached to a top surface of the raised center part of the protective tape 11. The silicon substrate 13 is attached to a top surface of the first metal layer 12. The second metal layer 14 is attached to a top surface of the substrate 13. The passivation layer 15 is attached to a top surface of the second metal layer 14.

In examples of the present disclosure, the WLCSP structure further comprises a plurality of connection members. Each connection member includes a metal pillar 16 (for example, a copper pillar) and a solder bump 18. Each connection member is electrically connected to the second metal layer 14 through an opening on the passivation layer 15. In one example, the metal pillar 16 goes through an opening formed on the passivation layer 15. A top surface of the metal pillar 16 is higher than a top surface of the passivation layer 15. A bottom surface of the metal pillar 16 is coplanar with a bottom surface of the passivation layer 15. In examples of the present disclosure, the second metal layer 14 has recesses to receive the metal pillars 16. The solder bump 18 is formed on the top surface of the metal pillar 16 for electrical connection with other components.

Molding compound 17 covers side walls of the metal pillar 16 and the top surface of the passivation layer 15. The molding compound 17 extends to cover side walls of the passivation layer 15, side walls of the second metal layer 14, side walls of the silicon substrate 13 and side walls of the first metal layer 12. The molding compound 17 covers the side edges of the protective tape 11. The arc-shaped surfaces at the side edges of the protective tape 11 increase the interface area between the molding compound 17 and the protective tape 11. Therefore, it strengthens mutual adhesion between the molding compound 17 and the protective tape 11. In examples of the present disclosure, without affecting the performance of the package structure, a respective interface surface between each of the first metal layer 12 and the molding compound 17, the substrate 13 and the molding compound 17, the second metal layer 14 and the molding compound 17, and the passivation layer 15 and the molding compound 17 has arc-shaped interface surface (similar to the arc-shaped surface between the molding compound 17 and the protective tape 11 as shown in FIG. 1). Therefore, it strengthens the mutual adhesion between the molding compound 17 and each of these layers. In examples of the present disclosure, the material for the first metal layer 12 is titanium (Ti), nickel (Ni) or silver (Ag).

Figure 2:
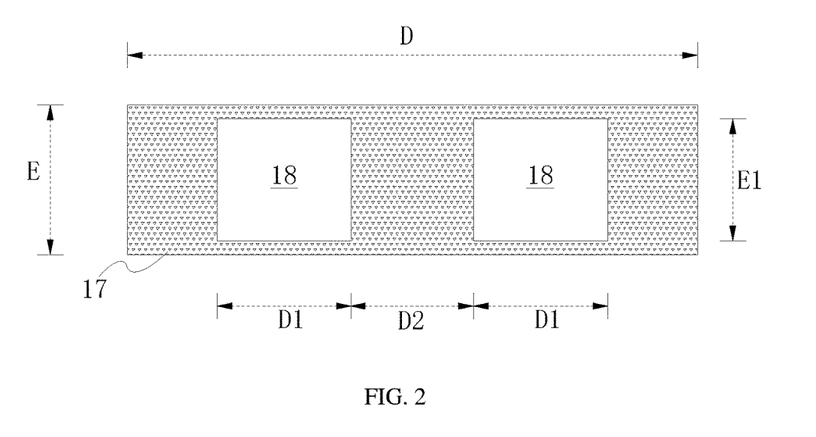
FIG. 2 is a top view of the WLCSP structure shown in FIG. 1.

FIG. 2 is a top view of the WLCSP structure shown in FIG. 1. In examples of the present disclosure, in FIGS. 1-2, a height A of the WLCSP structure ranges from 0.175 mm to 0.250 mm (preferably, 0.175 mm, 0.200 mm or 0.250 mm). A length D ranges from 0.585 mm to 0.615 mm (preferably, 0.585 mm, 0.600 mm or 0.615 mm). A width E ranges from 0.28500 to 0.315 mm (preferably, 0.285 mm, 0.300 mm or 0.315 mm). A length D1 of the connection member (including metal pillar 16 and solder bump 18) along the length direction D of the WLCSP structure (i.e., the lateral direction shown in FIG. 2) ranges from 0.090 mm to 0.190 mm (preferably, 0.090 mm, 0.140 mm or 0.190 mm). A width E1 of the connection member along the width direction E of the WLCSP structure ranges from 0.190 mm to 0.290 mm (preferably, 0.190 mm, 0.240 mm or 0.290 mm). A length D2 between adjacent connection members within the same WLCSP structure ranges from 0.210 mm to 0.310 mm (preferably, 0.210 mm, 0.260 mm or 0.310 mm).

The interface surface between the molding compound 17 and other layers is increased. It effectively increases the adhesion between the layers. The arc-shaped interface surfaces enhance the adhesion between the layers in the WLCSP structure. It effectively reduces the possibility of generating cracks between the layers in subsequent back treatment of the WLCSP structure, storage of the WLCSP structure and use of the WLCSP structure. It improves the performance of the package structure. The arc-shaped interface surface of two different materials suppresses the risk of product cracks, increase product yield, and improves quality and reliability. The arc-shaped interface surface arranged near the edge of the WLCSP structure improves the electrical conductivity and heat dissipation of the WLCSP structure.

FIGS. 3-12 are cross-sectional schematic diagrams showing a method for manufacturing the WLCSP structure of FIGS. 1-2. A plurality of WLCSP structures are fabricated from a wafer. For illustration purpose, FIGS. 3-12 only show fabrication of two WLCSP structures of the plurality of WLCSP structures. Each WLCSP structure has a plurality of metal pillars 24. For illustration purpose, FIGS. 3-12 show that each WLCSP structure has only two metal pillars 24 of the plurality of metal pillars 24.

Figure 3:
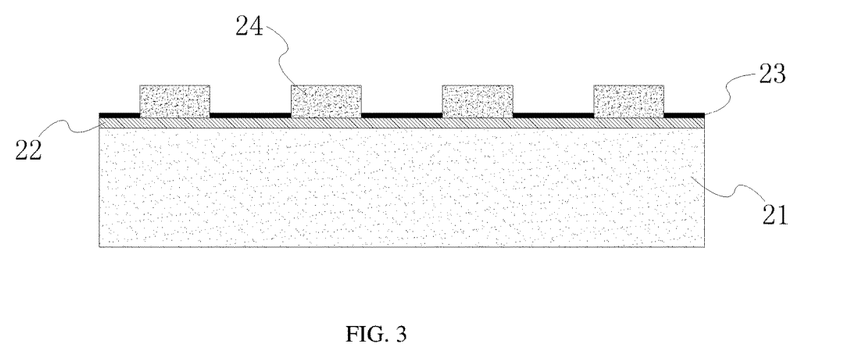
FIG. 3-12 are cross-sectional schematic diagrams illustrating a method for manufacturing a wafer level chip scale package structure in examples of the present disclosure.

The method may start from the step shown in FIG. 3. A second metal layer 22 (for example, an aluminum, Al) is deposited by sputtering (or other processes) on a top surface of a substrate 21 (for example, as silicon, Si). The top surface of the substrate 21 is an active area. A plurality of package units (two package units for illustration purpose, but not shown in FIG. 3) are associated with the top surface of the substrate 21. Each package unit is illustrated to associated with two metal pillars 24. A cutting space is arranged between two adjacent package units. The second metal layer 22 is used as a conducting layer for electric connection between the package units and the subsequently formed solder bumps 25 of FIG. 4. A passivation layer 23 is deposited on a top surface of the second metal layer 22. The passivation layer 23 is etched to form a plurality of openings. Portions of the top surface of the second metal layer 22 are exposed from the plurality of openings of the passivation layer 23. A plurality of metal pillars 24 (for example, copper pillars) are deposited on the exposed portions of the top surface of the second metal layer 22 The openings of the passivation layer 23 are entirely filled with the plurality of metal pillars 24. The plurality of metal pillars 24 connects to the top surface of the second metal layer 22. A top surface of the metal pillar 24 is higher than the top surface of the passivation layer 23.

Figure 4:
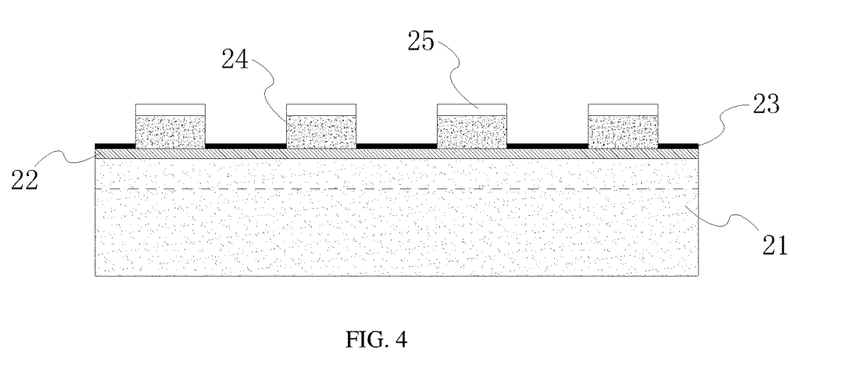
Figure 5:
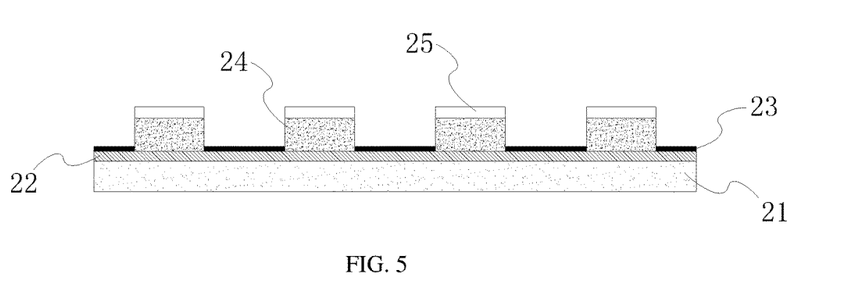

As shown in FIG. 4, a respective solder bump 25 is deposited on the top surface of each metal pillar 24 so as to form a respective connection member. Two adjacent connection members within the same package unit are electrically connected via the second metal layer 22.

Figure 6:
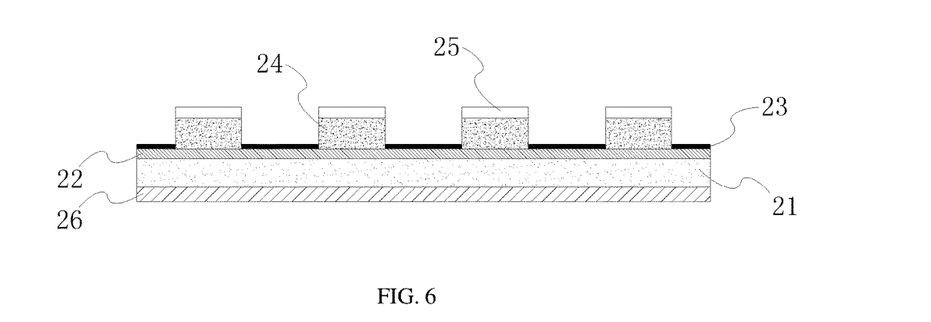

The substrate 21 is thinned from a backside. For example, a portion of the substrate 21 below the dotted line in FIG. 4 is removed so as to form a thinned substrate structure 21 shown in FIG. 5. As shown in FIG. 6, a first metal layer 26 (for example, a back metal) is formed, by sputtering or vapor deposition, on the back surface of the thinned substrate 21. In one example, the first metal layer 26 is a single-layer structure. In another example, the first metal layer 26 is a multi-layer structure. For example, the first metal layer 26 comprises materials selected from the group consisting of titanium (Ti), nickel (Ni) and silver (Ag). In examples of the present disclosure, the thickness of the first metal layer ranges from 8 µm to 10 µm.

Figure 7:
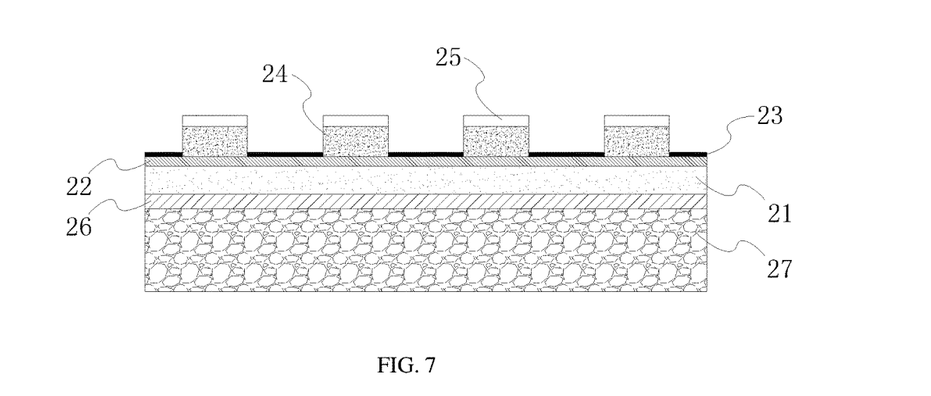
Figure 8:
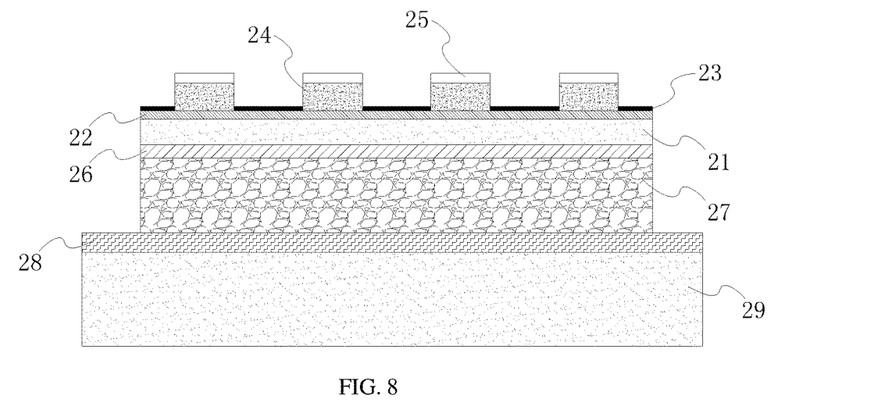

As shown in FIG. 7, a protective tape 27 is attached to a back surface of the first metal layer 26. As shown in FIG. 8, the structure as shown in FIG. 7 is then attached to a dummy wafer 29 by a double side tape 28.

Figure 9:
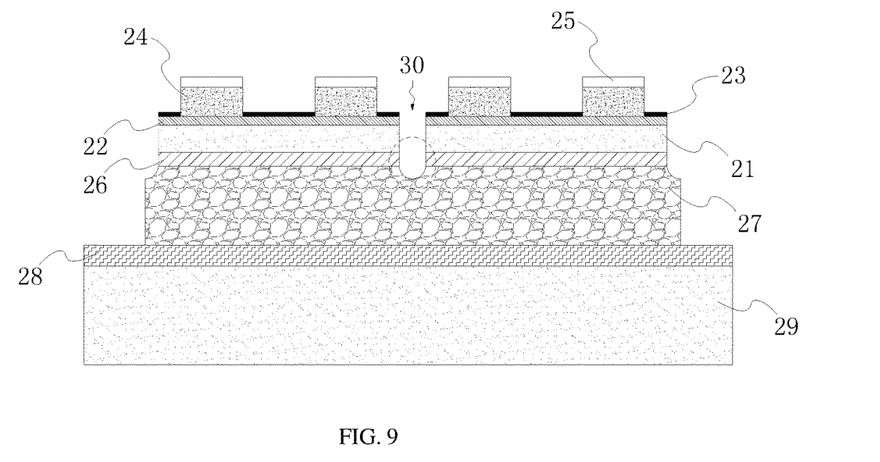

In FIG. 9, a pre-cut process is performed in the cutting space between two adjacent package units. The pre-cut depth is determined according to actual process requirements. In one example, the pre-cut does not cut through the protective tape 27 as shown in FIG. 9. In one example, the pre-cut cuts through the passivation layer 23, the second metal layer 22, the substrate 21, and the first metal layer 26. The pre-cut stops within the protective tape 27. A notch 30 formed by the pre-cut process has an arc-shaped bottom end. In one example, the arc-shaped bottom end has a constant radius of curvature (the area circled by the dotted line in FIG. 9) determined by a shape of the cutting tool.

Figure 10:
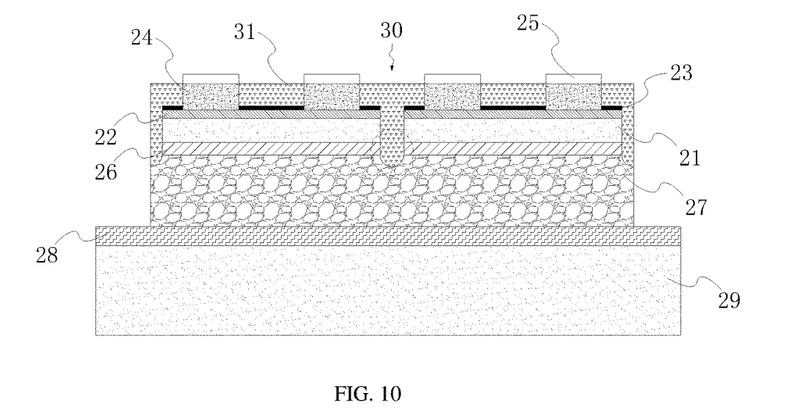

As shown in FIG. 10, a molding compound 31 is filled in the notch 30 and in the space formed between the adjacent connection members. The molding compound 31 covers the side walls of the metal pillar 24 and the top surface of the passivation layer 23. The molding compound 31 extends to cover side walls of the passivation layer 23, side walls of the second metal layer 22, side walls of the substrate 21 and side walls of the first metal layer 26. The molding compound 31 covers the arc-shaped side edges of the protective tape 27 (the area at the bottom of the notch 30). In one example, the material of the protective tape 27 is different from the material of the molding compound 31. In another example, the material of the protective tape 27 is the same as the material of the molding compound 31

Figure 11:
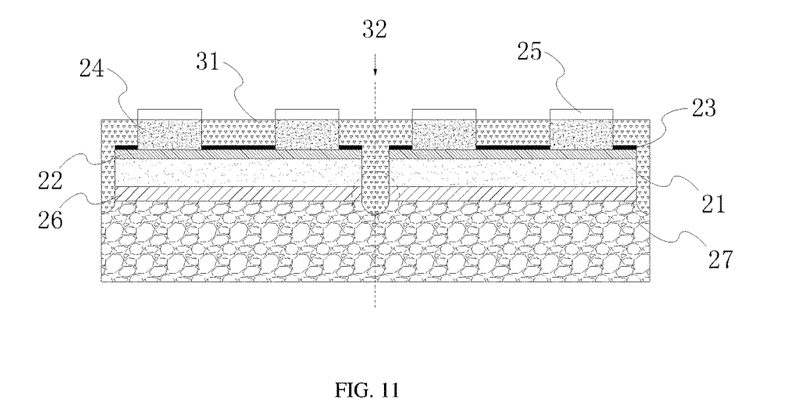
Figure 12:
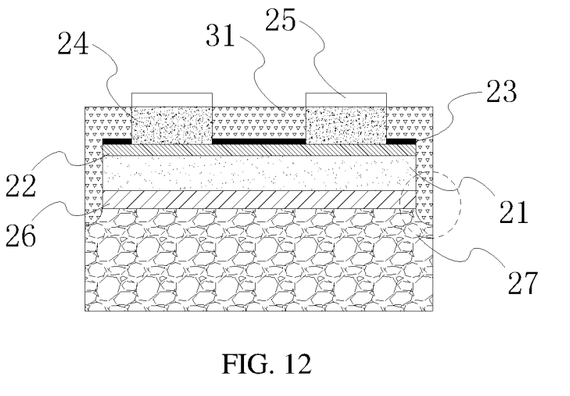

As shown in FIG. 11, the dummy wafer 29 and the double side tape 28 of the package structure of FIG. 10 are removed. A dicing process is applied by cutting along the direction indicated by an arrow 32 so as to form the individual WLCSP structures as shown in FIG. 12. The dicing process cut through the molding compound 31 filled over and in the notch and through the protective tape 27.

As shown in FIG. 11 and FIG. 12, the arc-shaped bottom end of the notch 30 results in the arc-shaped interface surface between the protective tape 27 and the molding compound 31. It effectively prevents the generation of cracks between the protective tape 27 and the molding compound 31 during the dicing process. In examples of the present disclosure, the pre-cut process and the dicing process are by laser cutting. The aperture of the cutting tool used in the dicing process is smaller than that used in the pre-cut process so that the final WLCSP structure comprises the arc-shaped interface surfaces. The arc-shaped interface surfaces increase the adhesion between the layers of the WLCSP structure, particularly between the protective tape 27 and the molding compound 31. It effectively reduces the possibility of generation of cracks between the layers of the WLCSP structure during back treatment, storage and use of the WLCSP structure. It improves the performance of WLCSP structure.

In addition to the arc-shaped interface surface between the protective tape 27 and the molding compound 31, the interface surfaces between the molding compound 31 and other layers (for example, the first metal layer 26, and the substrate 21) may be arc-shaped to increase inter-layer adhesion.

Those of ordinary skill in the art may recognize that modifications of the embodiments disclosed herein are possible. For example, the radius of curvature of the curved interface surface may vary. Other modifications may occur to those of ordinary skill in this art, and all such modifications are deemed to fall within the purview of the present invention, as defined by the claims.

The invention claimed is:

1. A wafer level chip scale package (WLCSP) structure comprising:
   a semiconductor die;
   a stack comprising:
      a protective tape; and
      a molding compound;
   wherein the semiconductor die is packaged in between the protective tape and the molding compound;
   wherein a portion of a first interface surface between the molding compound and the protective tape is curved; and
   wherein the first interface surface between the molding compound and the protective tape extends to an edge face of the semiconductor die.

2. The WLCSP structure of claim 1, wherein a portion of a second interface surface between the molding compound and the semiconductor die is curved.

3. The WLCSP structure of claim 1 further comprising:
   a connection member electrically connected to the semiconductor die;
   wherein a top surface of the connection member exposes from the molding compound so as to electrically connect the semiconductor die to external components.

4. The WLCSP structure of claim 3, wherein the connection member comprises a metal pillar and a solder bump, the metal pillar being electrically connected to the semiconductor die, and the solder bump being stacked on a top surface of the metal pillar.

5. The WLCSP structure of claim 4, wherein the semiconductor die comprises
   a substrate; and
   a passivation layer above a top surface of the substrate;
   an upper portion of the metal pillar being surrounded by the molding compound;
   a lower portion of the metal pillar passing through an opening of the passivation layer; and
   the metal pillar being electrically connected to the substrate.

6. The WLCSP structure of claim 5, wherein the semiconductor die further comprises a second metal layer in between the substrate and the passivation layer;
   wherein the metal pillar being directly connected to a top surface of the second metal layer.

7. The WLCSP structure of claim 6, wherein the semiconductor die further comprises a first metal layer directly attached to a bottom surface of the substrate;
   wherein a bottom surface of the first metal layer is directly attached to a top surface of the protective tape; and
   wherein sidewalls of the first metal layer connect to the molding compound.

8. The WLCSP structure of claim 7, wherein a portion of an interface surface between the molding compound and the first metal layer is curved; a portion of an interface surface between the molding compound and the substrate is curved; a portion of an interface surface between the molding compound and the second metal layer is curved; and a portion of an interface surface between the molding compound and the passivation layer is curved.

9. The WLCSP structure of claim 8, wherein the first metal layer comprises a material selected from the group consisting of titanium, nickel and silver;
   the substrate comprises silicon;
   the second metal layer comprises aluminum; and
   the metal pillar comprises copper.

10. The WLCSP structure of claim 1, wherein the portion of the first interface surface is an arc-shaped interface surface.

11. The WLCSP structure of claim 10, wherein the arc-shaped interface surface has a constant radius of curvature.

12. The WLCSP structure of claim 10, wherein the arc-shaped interface surface has a progressive changing of radii of curvatures from a first end to a second end of the arc-shaped interface surface.

13. The WLCSP structure of claim 1, wherein a sidewall of the protective tape and a sidewall of the molding compound are co-planar and wherein the sidewall of the protective tape is exposed from the sidewall of the molding compound.

14. The WLCSP structure of claim 1,
   wherein the semiconductor die comprises
      a first metal layer;
      a substrate;
      a second metal layer; and
      a passivation layer;
   wherein the WLCSP structure further comprises a connection member;
   wherein the connection member comprises
      a metal pillar; and
      a solder bump;
   wherein a bottom surface of the first metal layer is directly attached to a top surface of the protective tape;
   wherein a bottom surface of the substrate is directly attached to a top surface of the first metal layer;
   wherein a bottom surface of the second metal layer is directly attached to a top surface of the substrate;
   wherein a bottom surface of the passivation layer is directly attached to a top surface of the second metal layer;
   wherein an upper portion of the metal pillar being surrounded by the molding compound;
   wherein a lower portion of the metal pillar passing through an opening of the passivation layer;
   wherein a bottom surface of the metal pillar is directly attached to the top surface of the second metal layer;
   wherein the metal pillar is electrically connected to the substrate;
   wherein the solder bump is exposed from the molding compound; and
   wherein a bottom surface of the solder bump is directly attached to a top surface of the metal pillar.

15. The WLCSP structure of claim 14, wherein the top surface of the metal pillar is higher than the top surface of the passivation layer and wherein the bottom surface of the metal pillar is coplanar with the bottom surface of the passivation layer.

16. The WLCSP structure of claim 14, wherein the second metal layer has a recess to receive the metal pillar.

17. The WLCSP structure of claim 14, wherein the metal pillar is a single-piece construction.

18. The WLCSP structure of claim 1, wherein the protective tape and the molding compound are made of a same material.

19. A wafer level chip scale package (WLCSP) structure comprising:
- a semiconductor die comprising:
  - a substrate; and
  - a passivation layer above a top surface of the substrate;
  - a first metal layer directly attached to a bottom surface of the substrate; and
  - a second metal layer in between the substrate and the passivation layer;
- a stack comprising:
  - a protective tape; and
  - a molding compound;
- wherein the semiconductor die is packaged in between the protective tape and the molding compound; and
- wherein a portion of a first interface surface between the molding compound and the protective tape is curved; and
- wherein a portion of an interface surface between the molding compound and the first metal layer is curved; a portion of an interface surface between the molding compound and the substrate is curved; a portion of an interface surface between the molding compound and the second metal layer is curved; and a portion of an interface surface between the molding compound and the passivation layer is curved.

* * * * *